(12) United States Patent
Taubert et al.

(10) Patent No.: US 6,954,361 B2
(45) Date of Patent: Oct. 11, 2005

(54) EXPANDABLE ELECTRONIC EQUIPMENT ENCLOSURE

(75) Inventors: Tomasz Taubert, Overland Park, KS (US); Randall Hutchison, Shawnee, KS (US); Hans Marosfalvy, Lenexa, KS (US); Kevan Smith, Overland Park, KS (US)

(73) Assignee: Special Product Company, Overland Park, KS (US)

( * ) Notice: Subject to any disclaimer, the term of this patent is extended or adjusted under 35 U.S.C. 154(b) by 0 days.

(21) Appl. No.: 10/651,713

(22) Filed: Aug. 29, 2003

(65) Prior Publication Data

US 2005/0063143 A1 Mar. 24, 2005

Related U.S. Application Data

(60) Provisional application No. 60/407,132, filed on Aug. 29, 2002.

(51) Int. Cl.[7] .................................................. H05K 7/20
(52) U.S. Cl. ...................... 361/730; 361/683; 439/198; 439/577; 335/132
(58) Field of Search ................................ 361/600–831; 312/223.1, 223.2, 223.6; 455/128, 347–34; 165/80.3; 174/52.1, 59, 705; 439/184, 198, 207–211, 577; 335/132

(56) References Cited

U.S. PATENT DOCUMENTS 5,521,567 A * 5/1996 Devonald et al. ........... 335/132
5,685,729 A * 11/1997 Reider et al. ............... 439/206
6,419,512 B2 * 7/2002 Starck ......................... 439/378
6,430,044 B2   8/2002 Hutchinson
6,625,017 B1 * 9/2003 Lin et al. .................... 361/690
6,785,138 B1 * 8/2004 Rapey ......................... 361/704

* cited by examiner

Primary Examiner—Lynn Feild
Assistant Examiner—Anthony Q. Edwards
(74) Attorney, Agent, or Firm—Hovey Williams LLP

(57) ABSTRACT

An expandable, modular electronic equipment enclosure (8) for telecommunications, signaling, or other electronic equipment, wherein the enclosure (8) includes male and female expansion interfaces (20,22) that allow for expanding the enclosure (8) by adding substantially similar modules (110,210) whenever increased capacity is needed. Broadly, each module (10) includes a housing body (12); a lid (14); a base (16); the male and female expansion interfaces (20,22); and a cap (24). A single cable interface and pressurization control componentry (18) serves all of the modules (10,110,210) of the enclosure (8). To expand the enclosure (8), the male or female expansion interface (120, 122) of a subsequent module (110) is interfaced or mated with the corresponding exposed, unmated female or male expansion interface (20,22) of a preceding module (10). The cap (24) seals and protects the exposed, unmated expansion interface (120,122) of the last or end module (110) of the enclosure (8).

9 Claims, 4 Drawing Sheets

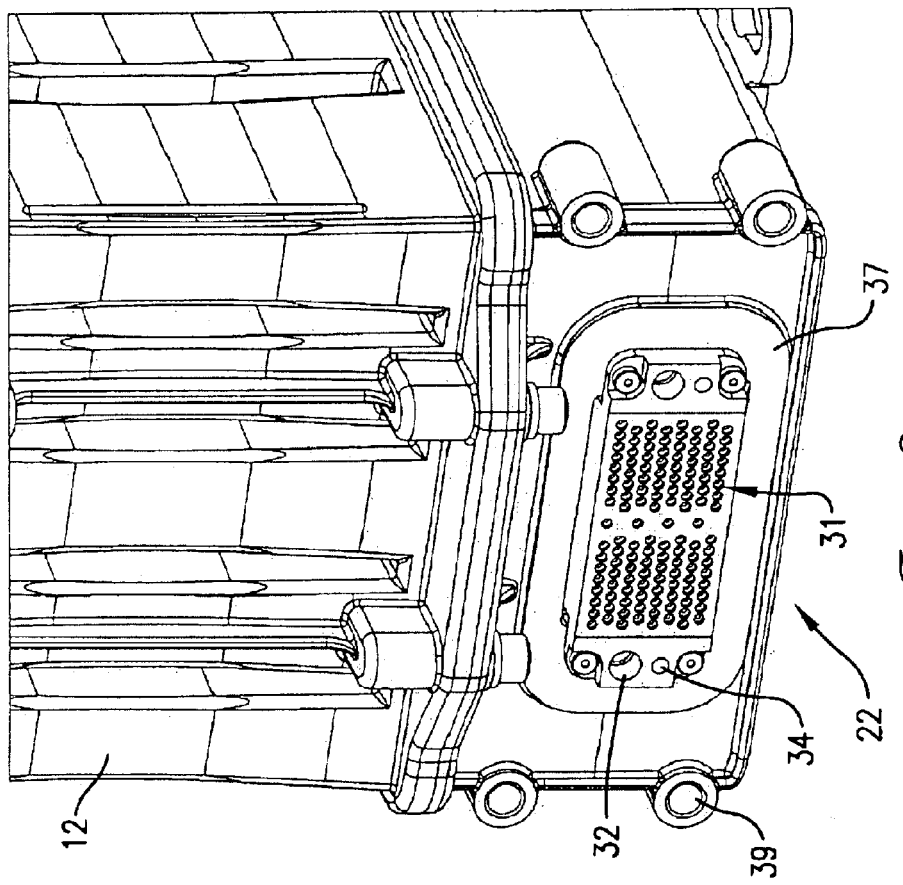
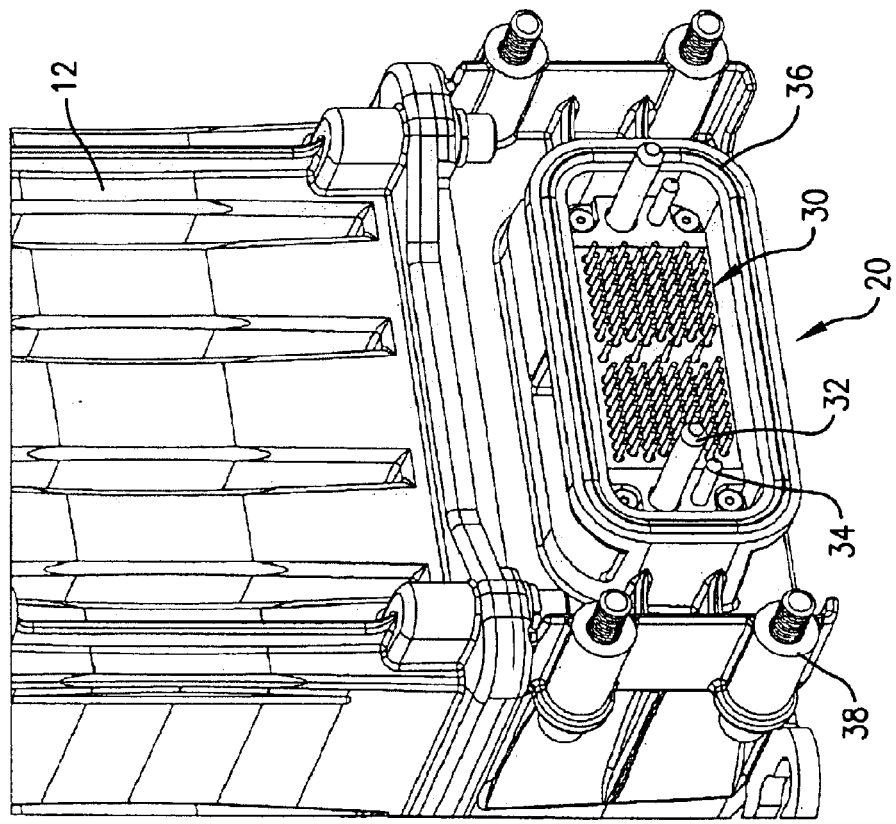

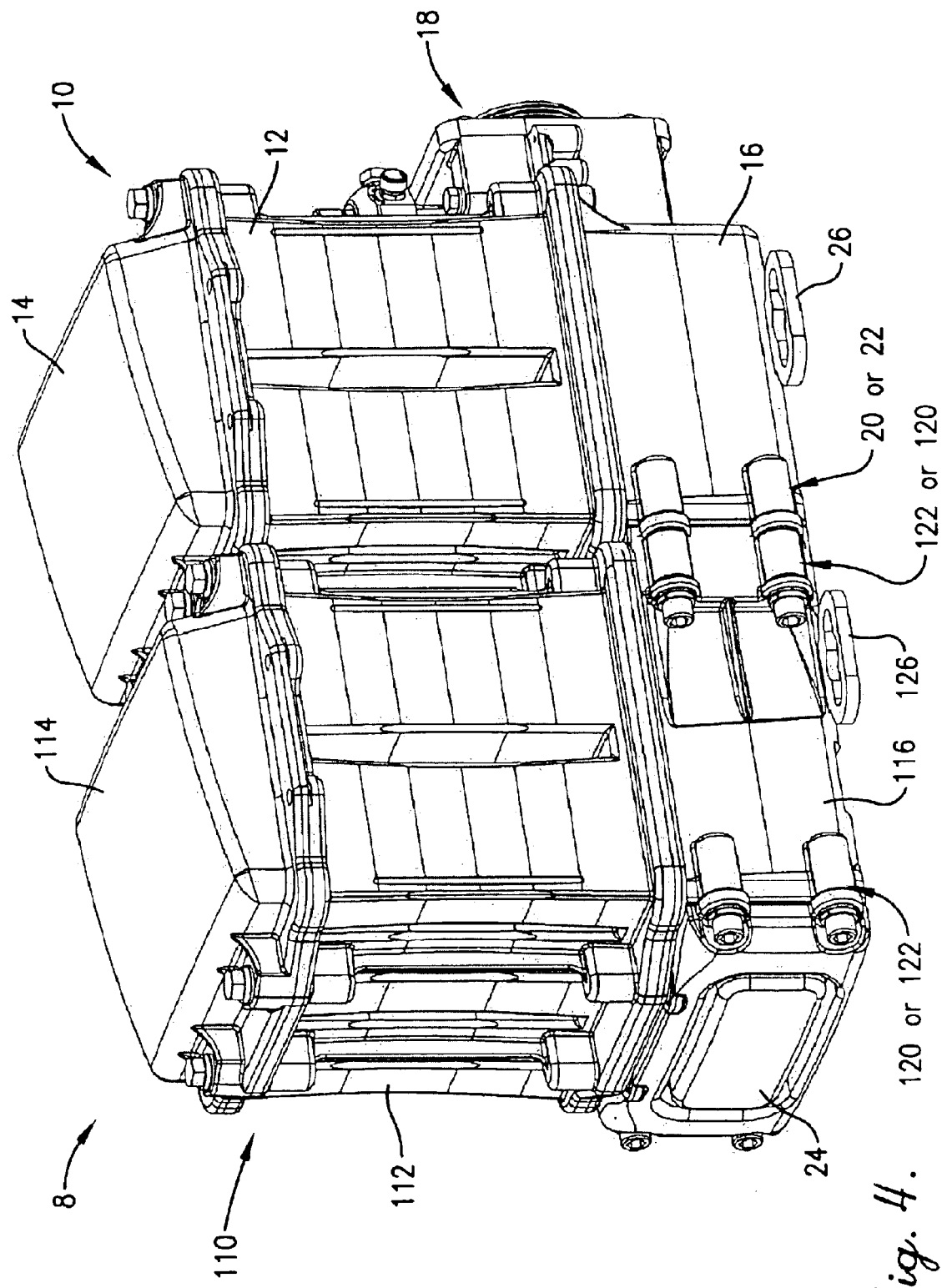

EXPANDABLE ELECTRONIC EQUIPMENT ENCLOSURE

RELATED APPLICATIONS

The present non-provisional patent application claims priority benefit, with regard to all common subject matter, of a copending U.S. provisional patent application titled MODULAR ELECTRONICS ENCLOSURE, Ser. No. 60/407,132, filed Aug. 29, 2002. The identified provisional application is hereby incorporated by reference into the present application.

BACKGROUND OF THE INVENTION

1. Field of the Invention

The present invention relates broadly to pressurizable enclosures for electronic equipment, particularly telecommunications or signaling equipment. More particularly, the present invention concerns an expandable, modular pressurizable electronic equipment enclosure for telecommunications, signaling, or other electronic equipment, wherein the enclosure includes male and female expansion interfaces that allow for expanding the enclosure by adding substantially similar modules whenever increased capacity is needed. A single cable interface and pressurization control componentry serves all of the modules of the enclosure.

2. Description of the Prior Art

It is often necessary to house telecommunications, signaling, and other similar electronic equipment in protective electronic equipment enclosures so that the electronic equipment may be located safely and reliably wherever needed, which is often in relatively harsh operating environments such as mounted on telephone poles or within subterranean manholes. Thus, the enclosures must be designed to protect the electronic equipment from a wide variety of environmental hazards, such as sun, moisture, dust, and debris, as well as damage from vandalism and attempted theft. Typically, this protection is achieved in part by positively pressurizing the enclosures to prevent potentially damaging and otherwise undesirable moisture and dust from infiltrating and reaching the electronic equipment. Such pressurization may be accomplished by splicing a cable stub into a trunk line in order to carry both electrical signals to and from the electronic equipment and pressurized gas (typically air) to the enclosure.

For example, ever-increasing use of wide area networks (WANs), particularly the Internet, and other telecommunication innovations has increased demand for high-speed, high-bandwidth digital telecommunications services, such as ISDN, (X)DSL, and T1, in homes and businesses. Due to signal propagation limitations, these digital services require special electronic equipment, including repeaters and doublers, to regenerate signals when end users are too far from a provider's central office. It is important that the enclosures safely and securely house multiple repeater units or "cards" or other similar electronic equipment in a space efficient manner.

Increasing demand for these services, however, requires a commensurate increase in capacity over time. Prior art electronic equipment enclosures accommodate only a limited number of the repeater/doubler cards, signaling circuitry, or other electronic equipment, whereafter the only recourse for increasing capacity is to install another separate and complete enclosure. This additional enclosure requires its own cable interface and pressurization control componentry, and a new cable stub needs be spliced into the trunk line and connected to the cable interface componentry. It will be appreciated that increasing capacity in this manner is both undesirably costly and time-consuming.

Thus, there exists a need for an improved electronic equipment enclosure that allows for easily and conveniently increasing capacity.

SUMMARY OF THE INVENTION

The present invention overcomes the above-described and other disadvantages in the prior art by providing an electronic equipment enclosure that is advantageously expandable to easily and conveniently accommodate increasing numbers of repeater/doubler cards or increasing amounts of signaling circuitry or other electronic equipment.

The preferred enclosure broadly comprises at least a first module having a first housing body; a first lid; a first base; a cable interface and pressurization control componentry; a first male expansion interface or a first female expansion interface; and a cap. The enclosure is expandable by interfacing or mating subsequent substantially similar modules to the first module. The first housing body receives, retains, and protects the electronic equipment. The first lid movably couples with and selectively seals a top portion of the housing body while allowing access to the electronic equipment as needed. The first base removably couples and substantially seals a bottom portion of the housing body. The first base may be provided with mounting componentry for securing the enclosure to an appropriate mounting surface. The cable interface and pressurization control componentry both interfaces a cable stub with the enclosure, wherein the cable stub carries both electric signals and a pressurizing gas, and allows for controlling pressurization of the enclosure by the pressurizing gas.

The first male or female expansion interface mates with a corresponding second female or male expansion interface of a second module. It should be noted that the second and subsequent modules do not include their own instances of the cable interface and pressurization control componentry, relying instead on the componentry associated with the first module. Each male expansion interface includes a number of pins; one or more air conduits; one or more guide projections; a circumferential seal; and a first half of a securement mechanism. Each female expansion interface includes a number of pin receptacles; one or more air conduit receptacles; one or more guide projection receptacles; a seal surface; and a second half of the securement mechanism. When the male and female expansion interfaces are interfaced or mated together the pins are received within and cooperate with the pin receptacles to carry the electrical signals between the cable stub and the electronic equipment housed within the modules; the air conduits are received within and cooperate with the air conduit receptacles to carry the air or other pressurized gas between the between the cable stub and the housing bodies; the guide projections cooperate and are received within the guide projection receptacles to ensure proper alignment when mating the modules; the circumferential seal cooperates with the seal surface to prevent loss of pressurization and avoid infiltration by moisture, dust, or other potentially damaging or otherwise undesirable substances and otherwise seals the modules together; and the first and second halves of the securement mechanism, which may be, respectively externally threaded rods and internally threaded rod receptacles, cooperate to securely but removably couple the male and female expansion interfaces of the modules. Whereas the first module may have only one male or female expansion interface, the second and subsequent modules will have both male and female expansion interfaces in order to couple with both preceding and subsequent modules.

The cap is adapted and operable to cover and seal the exposed, unmated expansion interface of the last or end module of the enclosure, whether it be the first, second, or a subsequent module. As subsequent modules are added, the cap is relocated to the last or end module of the enclosure.

Thus, it will be appreciated that the electronic equipment enclosure of the present invention provides a number of substantial advantages over the prior art, including, for example, allowing for expansion as needed to accommodate increased capacity in the form of greater numbers of repeater/doubler cards or greater amounts of signaling circuitry or other electronic componentry. This is advantageously accomplished by adding additional modules as needed using the male and female expansion interfaces. Furthermore, because the existing enclosure is expanded to increase capacity, rather than installing additional enclosures, it is not necessary when adding modules to provide and install additional cable interface and pressurization control componentry or to splice a new cable stub, thereby advantageously minimizing cost and installation time.

These and other important aspects of the present invention are more fully described in the section entitled DETAILED DESCRIPTION, below.

BRIEF DESCRIPTION OF THE DRAWINGS

A preferred embodiment of the present invention is described in detail below with reference to the attached drawing figures, wherein:

FIG. 2 is a fragmentary isometric view of the enclosure of FIG. 1, wherein can be seen a male expansion interface;

FIG. 3 is a fragmentary isometric view of the enclosure of FIG. 1, wherein can be seen a female expansion interface;

FIG. 4 is an isometric view of the enclosure of FIG. 1, wherein a second module has been interfaced or mated with the first module.

DETAILED DESCRIPTION OF A PREFERRED EMBODIMENT

Figure 1:
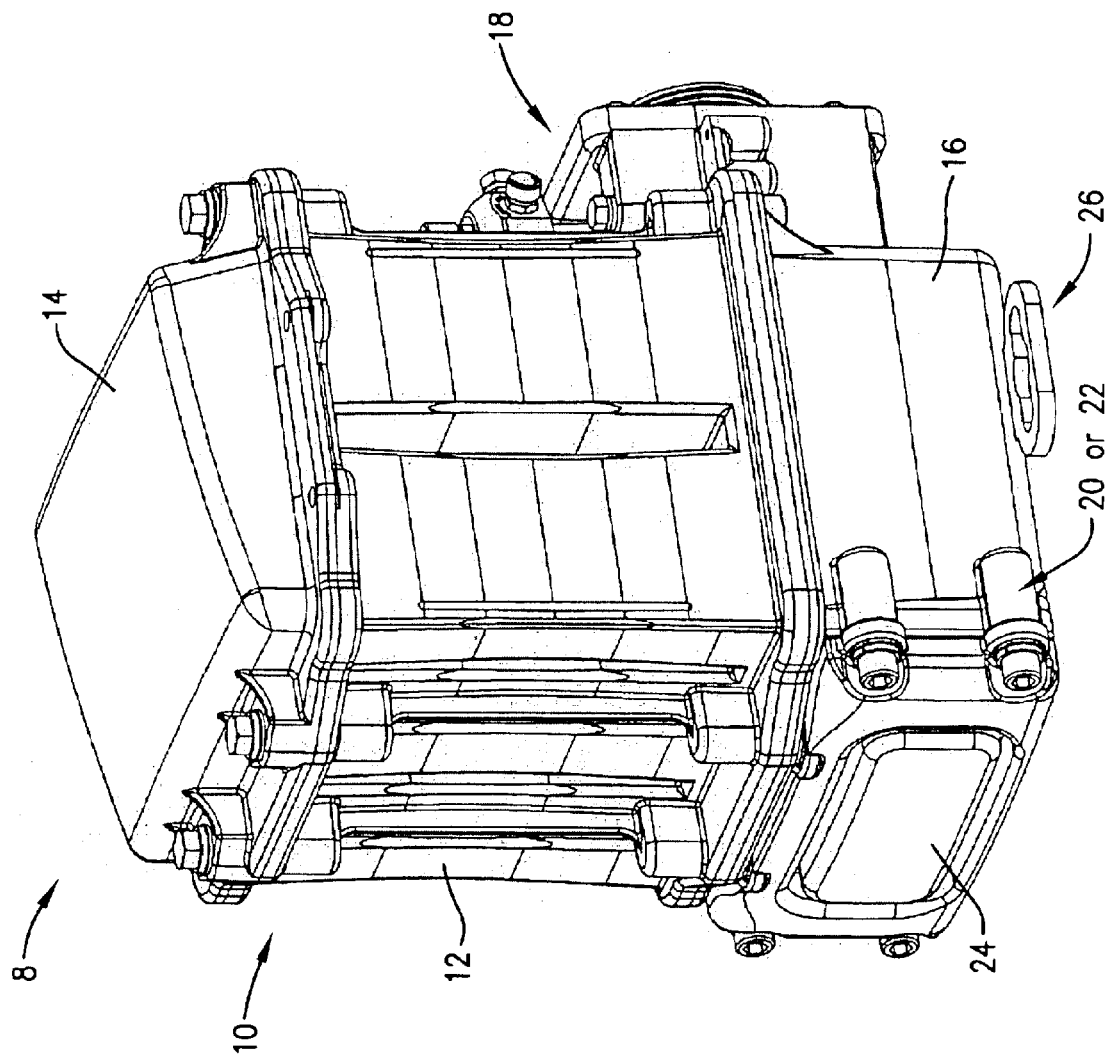
FIG. 1 is an isometric view of a preferred embodiment of an expandable electronic equipment enclosure of the present invention, wherein the enclosure includes a first module.

Referring to the figures, an electronic equipment enclosure 8 is described and disclosed herein as being constructed in accordance with a preferred embodiment of the present invention. The enclosure 8 is advantageously expandable to easily and conveniently accommodate increasing numbers of repeater/doubler cards or increasing amounts of signaling circuitry or other electronic equipment In the preferred embodiment, referring particularly to FIGS. 1–3, the enclosure 8 broadly comprises at least a first module 10 having a first housing body 12; a first lid 14; a first base 16; a cable interface and pressurization control componentry 18; a first male expansion interface 20 or a first female expansion interface 22; and a cap 24. As discussed below, the enclosure 8 is expandable by interfacing or mating subsequent substantially similar modules to the first module 10.

The first housing body 12 is substantially conventionally adapted and operable to receive, retain, and protect the electronic equipment. The housing body 12 may be any conventional or otherwise suitable shape (e.g., round, rectangular), and constructed of any conventional or otherwise suitable materials. As shown, the housing body 12 may incorporate the separated card holders feature described in U.S. Pat. No. 6,4330,044, titled TELECOMMUNICATIONS ENCLOSURE WITH INDIVIDUAL, SEPARATED CARD HOLDERS, issued Aug. 6, 2002, in order to provide more efficient cooling. The aforementioned issued patent is hereby incorporated by reference into the present application. It should be noted, however, that the present invention is substantially independent of any particular housing body design.

The first lid 14 is substantially conventionally adapted and a operable to movably couple with and selectively seal a top portion of the housing body 12 while allowing access to the electronic equipment as needed. It should be noted that the present invention is substantially independent of any particular lid design.

The first base 16 is substantially conventionally adapted and operable to removably couple and substantially seal a bottom portion of the housing body 12. The first base 16 may incorporate, couple with, or be otherwise provided with mounting componentry 26 for securing the enclosure 8 to an appropriate mounting surface (e.g., a wall or pole). It should be noted that the present invention is substantially independent of any particular base or mounting componentry design.

The cable interface and pressurization control componentry 18 is substantially conventionally adapted and operable to both interface, connect, or other wise mate a cable stub with the enclosure 8, wherein the cable stub carries both electrical signals and a pressurizing gas, and to allow for controlling pressurization of the enclosure 8 by the pressurizing gas. It will be appreciated by those with skill in the telecommunication and other relevant arts that enclosures such as the present enclosure 8 are positively pressurized in order to prevent potentially damaging and otherwise undesirable moisture and dust from infiltrating and reaching the electronic equipment. The cable stub is spliced into a trunk line that carries both the electrical signals to and from the electronic equipment and the pressurized gas (typically air) to the enclosure. It should be noted that the present invention is substantially independent of any particular cable interface and pressurization control componentry design.

The cable interface and pressurization control componentry 18 may be permanently mated with or incorporated or integrated into the base 16. In this case, the first module 10 may be provided with only one of the first male expansion interface 20 or the first female expansion interface 22, located on an opposite or adjacent side of the base 16 from the componentry 18. Alternatively, the cable interface and pressurization control componentry 18 may be adapted to removably interface or mate with one of the first male or first female expansion interfaces 20,22. In this case, the first module 10 may be provided with both the first male and first female expansion interfaces 20,22, one being taken by the componentry 18 and the other being available for mating with a second module 110.

Also, it is contemplated that minimal secondary control componentry (not shown) may be provided for each module. Such componentry may include, for example, a simple cut-off valve or pressure relief valve. Thus, the cable interface and pressurization control componentry 18 may not be the sole and exclusive means of controlling pressurization of all of the modules, though it is the primary control of the enclosure 8 generally.

The first male expansion interface 20 is adapted and operable to mate with either a second female expansion interface 122 of the second module 110, as shown in FIG. 4, or, as mentioned above, with the cable interface and pressurization control componentry 18. Similarly, the first female expansion interface 22 is adapted and operable to mate with either a second male expansion interface 120 of the second module 110 or with the cable interface and pressurization control componentry 18. As such, in each module the male and female expansion interfaces are located on opposite sides of the base. More particularly, with regard to expanding the enclosure 8 to accommodate more of the electronic equipment, the second module 110, having a second housing body 112; a second lid 114; and a second base 116 presenting the aforementioned second male and female expansion interfaces 120,122, is mated to the first module 10 by interfacing either the first male and second female expansion interfaces 20,122 or the second male and first female expansion interfaces 120,22, as appropriate. It should be again noted that the second 10 and subsequent modules do not include their own instances of the cable interface and pressurization control componentry 18, relying, at least primarily, on the componentry 18 associated with the first module 10.

Each male expansion interface 20,120 includes a number of pins or male terminals 30; one or more air conduits or first halves of passages 32; one or more guide projections 34; a circumferential seal 36; and a first half 38 of a securement mechanism. Each female expansion interface 22,122 includes a number of pin receptacles or female terminals 31; one or more air conduit receptacles or second halves of passages 33; one or more guide projection receptacles 35; a seal surface 37; and a second half 39 of the securement mechanism. When the male and female expansion interfaces are interfaced or mated together the pins 30 are received within and cooperate with the pin receptacles 31 to carry the electrical signals between the cable stub and the electronic equipment housed within the modules 10,110; the air conduits 32 are received within and cooperate with the air conduit receptacles 33 to carry the air or other pressurized gas between the between the cable stub and the housing bodies 12,112; the guide projections 34 cooperate and are received within the guide projection receptacles 35 to ensure proper alignment; the circumferential seal 36 cooperates with the seal surface 37 to prevent loss of pressurization and avoid infiltration by moisture, dust, or other potentially damaging or otherwise undesirable substances; and the first and second halves 38,39 of the securement mechanism, which may be, respectively externally threaded rods and internally threaded rod receptacles, cooperate to securely but removably couple the male and female expansion interfaces of the modules.

Figure 5:
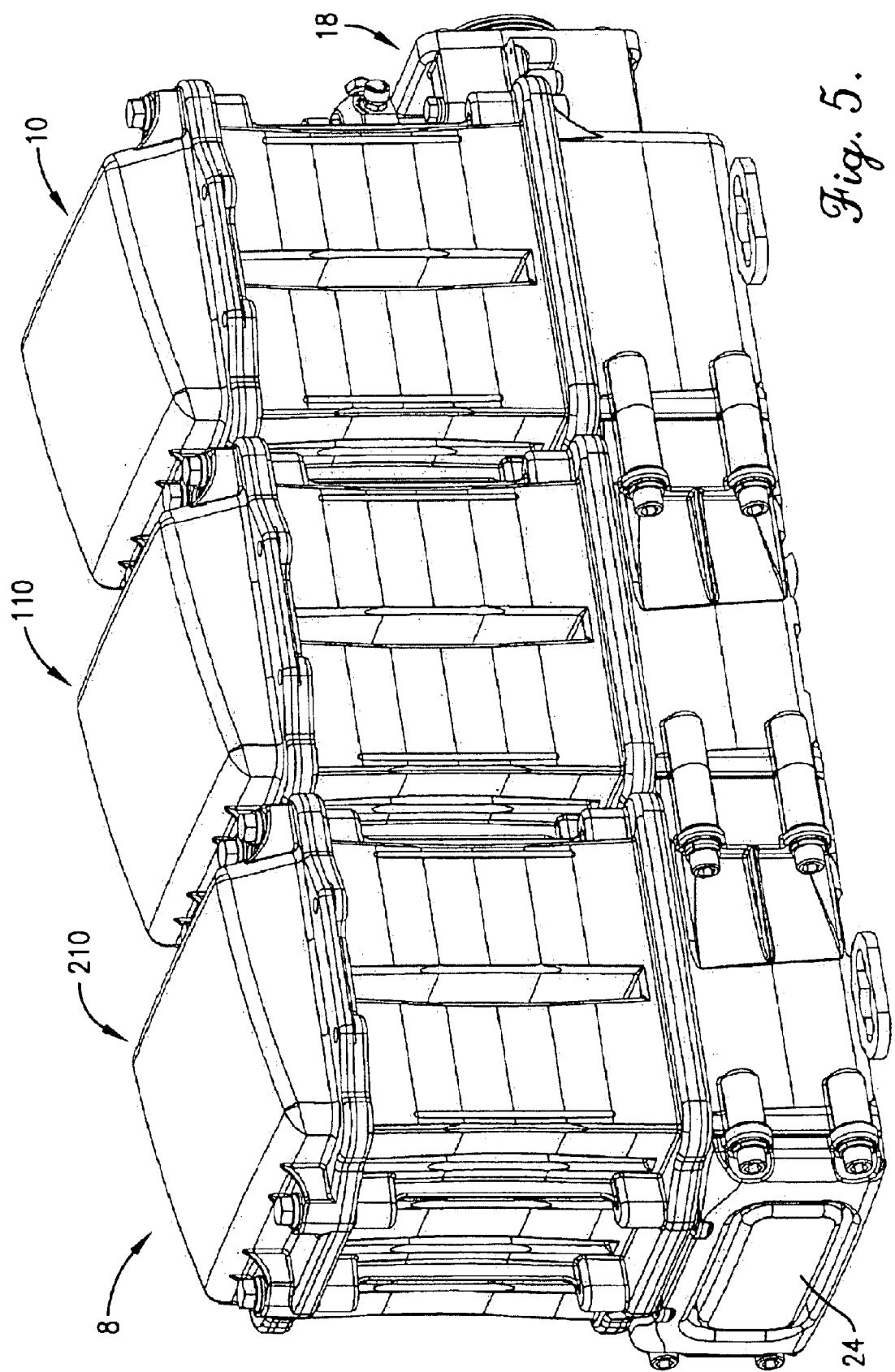
FIG. 5 is an isometric view of the enclosure of FIG. 4, wherein a third module has been interface or mated with the second module.

As indicated, whereas the first module 10 may have only one male or female expansion interface 20,22, particularly if the cable interface and pressurization control componentry 18 is incorporated or integrated int or otherwise interfaced or mated to the base 16, the second 110 and subsequent modules will have both male and female expansion interfaces in order to couple with both preceding and subsequent modules. As shown in FIG. 5, for example, a third module 210 may, as needed, be coupled with the second module 110 in substantially the same manner as the second module 110 is coupled with the first module 10. Thus, the enclosure 8 expands to accommodate more of the electronic equipment, with each subsequent module added after the first module 10 effectively doubling the enclosure's capacity.

The cap 24 is adapted and operable to cover and seal the exposed, unmated male or female expansion interface of the last or end module of the enclosure 8, whether it be the first, second, or a subsequent module. The cap 24 preferably removably couples with the securement mechanism of the expansion interface, and includes a complementary seal or seal surface as well. As subsequent modules are added, the cap 24 is be relocated to the last or end module of the enclosure 8.

In exemplary use and operation, the enclosure 8 of the present invention may be used as follows. In this example, required capacity is initially such that the necessary electronic equipment fits within the first module 10. Thus, the first module 10 is appropriately mounted using the mounting componentry 26, and the cable stub is interfaced or mated with the cable interface and pressurization control componentry 18 so as to deliver both electrical signals to the electronic equipment and pressurized air to the first housing body 12.

Sometime thereafter, demand increases such that additional electronic equipment is needed which will not fit within the first housing module 10. Thus, the cap 24 is removed from the first male or female expansion interface 20,22, and the second module 110 is mated thereto such that the electrical signals are carried to the electronic equipment housed therein and the pressurized air is carried to and pressurizes the second housing body 110. The cap 24 is relocated to the now exposed, unmated male or female expansion interface 120,122 of the second module 110.

Thereafter, subsequent housing modules are added in substantially the same manner as the need arises.

From the preceding description, it will be appreciated that the electronic equipment enclosure of the present invention provides a number of substantial advantages over the prior art, including, for example, allowing for expansion as needed to accommodate increased capacity in the form of greater numbers of repeater/doubler cards or greater amounts of signaling circuitry or other electronic componentry. This is advantageously accomplished by adding additional modules as needed, using the male and female expansion interfaces. Furthermore, because the existing enclosure is expanded to increase capacity, rather than installing additional enclosures, it is not necessary when adding modules to provide and install additional cable interface and pressurization control componentry or to splice a new cable stub, thereby advantageously minimizing cost and installation time.

Although the invention has been described with reference to the preferred embodiments illustrated in the attached drawings, it is noted that equivalents may be employed and substitutions made herein without departing from the scope of the invention as recited in the claims. Furthermore, applications and uses are contemplated for the device herein described that require only minor modifications to the device as disclosed. Thus, for example, the enclosure of the present invention is substantially independent of any particular housing body, lid, base, mounting structure, or cable interface and pressurization control componentry design.

Having thus described the preferred embodiment of the invention, what is claimed as new and desired to be protected by Letters Patent includes the following:

1. An expandable enclosure for housing electronic equipment, the enclosure comprising:

at least one pressurizable first module including— a cable interface and pressurization control componentry for interfacing the first module with a cable stub and for controlling pressurization of the first module, and at least one expansion interface allowing for mating the first module with a substantially similar pressurizable second module in such a manner that the cable interface and pressurization control componentry controls pressurization of both the first and second modules.

2. The expandable enclosure as set forth in claim 1, wherein the first module further includes— a housing body for receiving the electronic equipment;

a lid for movably coupling with and selectively sealing a top portion of the housing body;

a base for substantially removably coupling with and sealing a bottom portion of the housing body; and a cap for removably coupling with and sealing the expansion interface when the first module is not mated to the second module.

3. The expandable enclosure as set forth in claim 1, wherein the expansion interface includes— a plurality of terminals for carrying electrical signals to the electronic equipment housed within the second module;

at least one air passage for pressurizing the second module;

at least one guide for ensuring proper alignment with the second module; and a sealing mechanism for sealing the first module to the second module.

4. An expandable enclosure for housing electronic equipment, the enclosure comprising:

at least one pressurizable first module including— a cable interface and pressurization control componentry for interfacing the first module with a cable stub and for controlling pressurization of the first module, and at least one expansion interface allowing for mating the first module with a substantially similar pressurizable second module in such a manner that the cable interface and pressurization control componentry controls pressurization of both the first and second modules, wherein the expansion interface includes— a plurality of terminals for carrying electrical signals to the electronic equipment housed within the second module;

at least one air passage for pressurizing the second module;

at least one guide for ensuring proper alignment with the second module; and a sealing mechanism for sealing the second module to the first module.

5. The expandable enclosure as set forth in claim 4, wherein the first module further includes— a housing body for receiving the electronic equipment;

a lid for movably coupling with and selectively sealing a top portion of the housing body;

a base for substantially removably coupling with and sealing a bottom portion of the housing body; and a cap for removably coupling with and sealing the expansion interface when the first module is not mated to the second module.

6. An expandable enclosure for housing electronic equipment, the enclosure comprising:

a pressurizable first module including— a cable interface and pressurization control componentry for interfacing the first module with a cable stub and for controlling pressurization of the first module, and at least one first expansion interface; and a pressurizable second module substantially similar to the first module and including— a second expansion interface cooperating with the first expansion interface of the first module to mate the second module with the first module in such a manner that the cable interface and pressurization control componentry controls pressurization of both the first and second modules.

a third expansion interface located substantially opposite the second expansion interface and allowing for mating the second module with a substantially similar pressurizable third module in such a manner that the cable interface and pressurization control componentry controls pressurization of both the first, second, and third modules.

7. The expandable enclosure as set forth in claim 6, wherein each of the first and second modules includes— a housing body for receiving the electronic equipment;

a lid for movably coupling with and selectively sealing a top portion of the housing body; and a base for substantially removably coupling with and sealing a bottom portion of the housing body.

8. The expandable enclosure as set forth in claim 6, wherein the second module further includes a cap for removably coupling with and sealing the third expansion interface when the second module is not mated to the third module.

9. The expandable enclosure as set forth in claim 6, wherein each of the first, second, and third expansion interfaces includes a complementary portion of— a plurality of terminals for carrying electrical signals to the electronic equipment;

at least one air passage;

at least one guide for ensuring proper alignment; and a sealing mechanism.

\* \* \* \* \*